(12) United States Patent
Sung et al.

(10) Patent No.: US 10,267,488 B2
(45) Date of Patent: Apr. 23, 2019

(54) METHOD FOR PREPARING QUANTUM DOT-POLYMER COMPLEX, QUANTUM DOT-POLYMER COMPLEX, LIGHT CONVERSION FILM, BACKLIGHT UNIT AND DISPLAY DEVICE HAVING THE SAME

(71) Applicant: LG ELECTRONICS INC., Seoul (KR)

(72) Inventors: Jinwoo Sung, Seoul (KR); Moongoo Choi, Seoul (KR); Hyunkwon Shin, Seoul (KR); Dongseon Jang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 59 days.

(21) Appl. No.: 14/712,771

(22) Filed: May 14, 2015

(65) Prior Publication Data

US 2016/0161066 A1    Jun. 9, 2016

(30) Foreign Application Priority Data

Dec. 8, 2014 (KR) ........................ 10-2014-0175325

(51) Int. Cl.
| | |
|---|---|
| *F21K 9/64* | (2016.01) |
| *F21V 9/30* | (2018.01) |
| *C09K 11/08* | (2006.01) |
| *C09K 11/70* | (2006.01) |
| *H01L 33/50* | (2010.01) |
| *G02B 1/04* | (2006.01) |
| *F21Y 115/10* | (2016.01) |

(52) U.S. Cl.
CPC .............. *F21V 9/30* (2018.02); *C09K 11/703* (2013.01); *F21K 9/64* (2016.08); *G02B 1/04* (2013.01); *H01L 33/502* (2013.01); *F21Y 2115/10* (2016.08)

(58) Field of Classification Search
CPC ........................................ C09K 11/08–11/897
See application file for complete search history.

(56) References Cited

U.S. PATENT DOCUMENTS

| | | | |
|---|---|---|---|
| 9,158,149 B2 | 10/2015 | Jung et al. | |
| 9,541,256 B2* | 1/2017 | Sung | ......................... F21V 9/16 |
| 2011/0068321 A1* | 3/2011 | Pickett | ................. C09K 11/025 |
| | | | 257/13 |

(Continued)

FOREIGN PATENT DOCUMENTS

| | | |
|---|---|---|
| EP | 2584623 A2 | 4/2013 |
| EP | 2526836 A1 | 1/2015 |

(Continued)

OTHER PUBLICATIONS

Cook, W. D. Thermal aspects of the kinetics of dimethacrylate photopolymerization. Polymer, 1992, vol. 33, No. 10, pp. 2152-2161.*

*Primary Examiner* — Stephen E Rieth
(74) *Attorney, Agent, or Firm* — Birch, Stewart, Kolasch & Birch, LLP

(57) ABSTRACT

A quantum dot-polymer complex and a method for preparing the same. The quantum dot-polymer complex includes a first phase formed of a matrix resin, a globular second phase dispersed in the first phase, the second phase including a quantum dot therein, and a third phase disposed along a surface of the second phase between the first and second phases.

15 Claims, 5 Drawing Sheets

(56) References Cited

U.S. PATENT DOCUMENTS

| | | |
|---|---|---|
| 2012/0256134 A1 | 10/2012 | Nick |
| 2013/0099213 A1 | 4/2013 | Jun et al. |
| 2013/0112942 A1 | 5/2013 | Kurtin et al. |
| 2013/0265522 A1 | 10/2013 | Jung et al. |
| 2014/0275431 A1 | 9/2014 | Freeman et al. |
| 2015/0072092 A1 | 3/2015 | Seo et al. |
| 2015/0286094 A1 | 10/2015 | Jung et al. |
| 2015/0301257 A1 * | 10/2015 | Choi .................. C09K 11/025 362/607 |
| 2016/0068749 A1 * | 3/2016 | Kwon ................. C09K 11/025 252/301.36 |

FOREIGN PATENT DOCUMENTS

| | | | |
|---|---|---|---|
| KR | 10-2012-0131419 A | 12/2012 | |
| KR | 10-2013-0105511 A | 9/2013 | |
| KR | 10-2013-0105544 A | 9/2013 | |
| KR | 10-2013-0112990 A | 10/2013 | |
| KR | 10-2014-0102211 A | 8/2014 | |
| KR | 10-1463416 B1 | 11/2014 | |
| WO | WO 2013137689 A1 * | 9/2013 | ............. C09K 11/02 |
| WO | WO-2014073894 A1 * | 5/2014 | ........... G02B 3/0043 |
| WO | WO-2014073895 A1 * | 5/2014 | ........... C09K 11/025 |

* cited by examiner (A)

(B)

METHOD FOR PREPARING QUANTUM DOT-POLYMER COMPLEX, QUANTUM DOT-POLYMER COMPLEX, LIGHT CONVERSION FILM, BACKLIGHT UNIT AND DISPLAY DEVICE HAVING THE SAME

CROSS-REFERENCE TO RELATED APPLICATIONS

This application claims the benefit of Korean Patent Application No. 10-2014-0175325, filed on Dec. 8, 2014, which is hereby incorporated by reference in its entirety into this application.

BACKGROUND OF THE INVENTION

Field of the Invention

The present disclosure relates to a quant dot-polymer complex and a method for preparing the same, and more particularly, to a method for preparing a quantum dot-polymer complex that reduces the degradation under high-temperature high-humidity environments and preparing a film having a uniform thickness, a quantum dot-polymer complex prepared by using the same, and a light conversion film, a backlight unit, and a display device, which have the same.

Description of the Related Art

Liquid crystal displays (LCDs), plasma display panel devices (PDPs), electroluminescence displays (ELDs), field emission displays (FEDs), and the like are introduced as flat panel displays (FPDs) having advantages such as slimness, lightweight, low power consumption, and are replacing existing cathode ray tubes (CRTs).

Among these, LCDs have low power consumption, good portability, technology compactness, and high added-value. LCDs are also non-emissive type devices and thus do not form an image by itself. Also, since LCDs are light receiving displays that receive light incident from the outside to form an image, an additional light source is needed. Cathode fluorescent lamps (CCFLs) have been mainly used as light sources of LCDs in the past. However, CCFLs have difficulty in securing of brightness uniformity and are deteriorated in color purity if CCFLs are manufactured in large scale.

Thus, three-color light emitting diodes (LEDs) instead of the CCFLs are being used in recent years as light sources of LCDs. When three-color LEDs are used, a high color purity can be realized to implement high-quality images. However, since the three-color LEDs are very expensive, the manufacturing costs increase. As a result, relatively inexpensive blue LEDs are being used as light sources. For this, technologies for converting blue light into red light and green light by using a light conversion film including quantum dots (QDs) to realize white light are being researched.

When the light conversion films using QDs are manufactured, it is preferably to uniformly disperse the QDs into a matrix resin. That is, if the QDs are aggregated, the light emitted from a light source passes through at least two QDs and thus is reabsorbed thereby deteriorating the light emitting efficiency. However, currently produced QDs have surfaces that are capped by using hydrophobic ligands so as to improve dispersibility. Thus, the types of dispersible media is limited, and the types of resins used for manufacturing films is limited.

Light conversion films also include a barrier film attached on top and bottom surfaces of the light conversion film, and QDs located in an edge portion of the film become oxidized by oxygen or moisture permeated through a side surface not including a separate barrier unit. A matrix resin having a low penetration ratio with respect to oxygen or moisture may be used to prevent this phenomenon from occurring. However, QDs are not well dispersed into resins having low vapor-permeability and/or moisture-permeability.

To solve the above-described limitation, matrix resins having low vapor-permeability and/or moisture-permeability are heated at a high temperature and then mixed with QDs. However, since the QDs are easily degraded at a high temperature, the QDs are deteriorated in light emitting efficiency.

In addition, a method for preparing a light conversion film by dispersing quantum dots into a matrix resin including specific contents of a polyfunctional light-curable oligomer and monofunctional light-curable monomer, which have an acid value of about 0.1 mgKOH/g or less, and then curing the matrix resin is disclosed in Korean Patent Publication No. 10-2012-0035157. According to the above-described method, after the quantum dots are dissolved into the monofunctional light-curable monomer that is a nonpolar material, the monofunctional light-curable monomer is phase-separated from the polyfunctional light-curable oligomer having high viscosity to form an emulsion, and then the quantum dots are dispersed into the matrix resin in the form of the emulsion.

However, since each of the emulsions formed by the above-described method is temporarily maintained by the high viscosity of the polyfunctional light-curable oligomer, the emulsions may be fused with each other as a time elapses. As a result, each of the emulsions may increase in size, and thus, the emulsions may increase in size distribution. Thus, the emulsions each of which has a size similar to a costing thickness may exist. Accordingly, when coating is performed, the emulsions may be pushed by a coating bar to generate stripes in a costing direction or to increase in size toward an end of the film. As a result, it is difficult to prepare a light conversion film having uniform optical performance.

SUMMARY OF THE INVENTION

Accordingly, one object of the present invention is to address the above-noted and other problems with the related art.

Another object of the present invention is to provide a quantum dot-polymer complex which has low degradation under high-temperature high-humidity environments, a film having a uniform thickness, and to realize uniform optical performance over an entire surface of the film, and a method for preparing the same.

In still another aspect, the present invention provides a light conversion film, a backlight unit, and a display device, which have a quantum dot-polymer complex.

To achieve these and other advantages and in accordance with the purpose of the present invention, as embodied and broadly described herein, the present invention provides in one aspect a quantum dot-polymer complex comprising a first phase formed of a matrix resin; a globular second phase dispersed in the first phase, the second phase comprising a quantum dot therein; and a third phase disposed along a surface of the second phase between the first and second phases. The present invention also provides a corresponding method for preparing the quantum dot-polymer complex, and light conversion filter, backlight unit and display device including the light conversion layer.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by illustration only, and thus are not limitative of the present invention, and wherein.

DETAILED DESCRIPTION OF THE EMBODIMENTS

Reference will now be made in detail to the preferred embodiments of the present invention, examples of which are illustrated in the accompanying drawings.

The inventors developed a light conversion film having superior stability under high-temperature high-humidity environments and realizing relatively uniform optical performance over an entire area thereof. A quantum dot-polymer complex is provided in which quantum dots and oligomer having polar moiety and nonpolar moiety are mixed and dispersed into a matrix resin.

Figure 1:
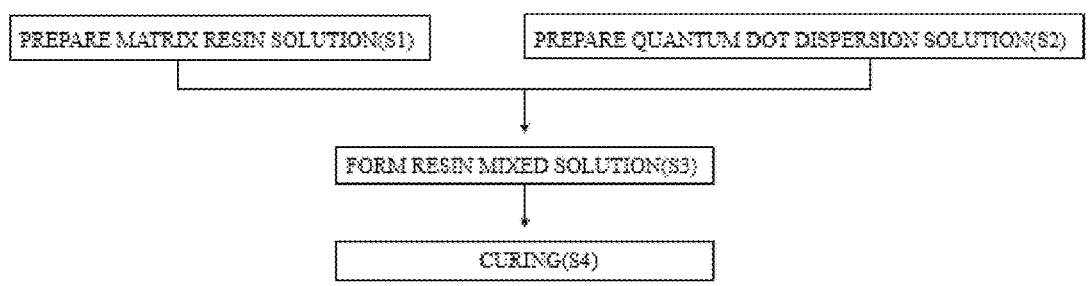
FIG. 1 is a view illustrating a method for preparing a light conversion complex according to an embodiment.

First, a method for preparing a quantum dot-polymer complex according to an embodiment will be described below. FIG. 1 is a view illustrating a method for preparing a quantum dot-polymer complex according to an embodiment. Referring to FIG. 1, the method of preparing the quantum dot-polymer complex includes a process (S1) of preparing a matrix resin solution, a process (S2) of preparing a quantum dot dispersion solution, a process (S3) of forming a resin mixed solution, and a process (S4) of curing the resin mixed solution.

First, in operation S1, the matrix resin solution is prepared. Here, the matrix resin solution includes a matrix resin and a photo-initiator. The matrix resin may have a resin having low moisture-permeability and vapor-permeability. In more detail, a quantum dot is easily degraded by oxygen or moisture. Thus, to prevent the quantum dot from being degraded, a resin having the low moisture-permeability and vapor-permeability is preferably used as the matrix resin that surrounds the quantum dot. For example, the matrix resin may include, but is not limited thereto, epoxy, epoxy acrylate, polychloro tri-fluoroethylene, polyethylene, polypropylene, polyvinyl alcohol, and a combination thereof.

The epoxy resin may be a resin having an epoxy group, for example, a bisphenol A resin, a bisphenol F resin, and the like. The epoxy resins may have low moisture-permeability and vapor-permeability due to characteristics of a main chain. The epoxy acrylate resin may be a resin in which an epoxide group of an epoxy resin substitutes for an acrylic group. For example, the epoxy acrylate resin may be one selected from the group consisting of bisphenol A glycerolate diacrylate, bisphenol A ethoxylate diacrylate, bisphenol A glycerolate dimethacrylate, bisphenol A ethoxylate dimethacrylate, and a combination thereof. The epoxy acrylate resin may have low moisture-permeability and vapor-permeability due to the characteristics of the main chain, like the epoxy resin.

Also, the polychloro tri-fluoroethylene may have low moisture and oxygen permeability, the polyethylene and polypropylene may have low moisture permeability, and the polyvinyl alcohol may have low oxygen permeability. Preferably, the matrix resin is an epoxy (meth)acrylate.

The epoxy (meth)acrylate that is usable in an embodiment may be, but is not limited thereto, an epoxy (meth)acrylate that is represented by following (Chemical Formula 1).

(Chemical Formula 1)

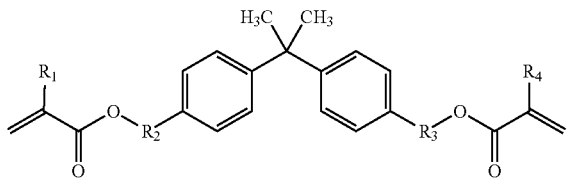

In (Chemical Formula 1), each of $R_1$ and $R_4$ is independently selected from hydrogen or $C_{1-10}$ alkyl, and each of $R_2$ and $R_3$ is independently selected from

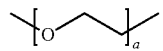

(where, a is integers 1 to 10) or

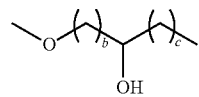

(where, b and c are independently selected from integers 0 to 10).

More preferably, the epoxy (meth)acrylate may be one selected from the group consisting of bisphenol A glycerolate diacrylate, bisphenol A ethoxylate diacrylate, bisphenol A glycerolate dimethacrylate, bisphenol A ethoxylate dimethacrylate, and a combination thereof.

A content of the epoxy (meth)acrylate may be about 30 wt % to about 99 wt %, preferably, about 40 wt % to about 80 wt %, more preferably, about 50 wt % to about 70 wt % of the total weight of the matrix resin solution. When the content of the epoxy (meth)acrylate within the matrix resin solution satisfies the above-described range, the preparation of the film may be easy, and also the degradation of the quantum dot may be effectively prevented.

As described above, since the epoxy (meth)acrylate having the low moisture-permeability and vapor-permeability is used as a main component of the matrix resin, the degradation of the quantum dot due to the oxygen and moisture, particularly, the degradation of the quantum dot at an edge portion may be effectively minimized. The photo-initiator may initialize photopolymerization of the expoxy (meth) acrylate resin contained in the matrix resin. In the current embodiment, radical-type photopolymerization initiators that well known in this technical fields may be used without being limited. For example, Irgacure 184 may be used as the photo-initiator.

A content of the photo-initiator may be about 1 wt % to about 15 wt %, preferably, about 5 wt % to about 15 wt %, more preferably, about 5 wt % to about 15 wt % of the total weight of the matrix resin solution. If the content of the photo-initiator is out of the above-described range, the light conversion film may be deteriorated in performance.

The matrix resin solution may further contain other components in addition to the above-described components to adjust physical properties such as viscosity, adhesion, flexibility, a degree of cure, photo-performance, and the like. For example, a (meth) acrylic monomer including at least one functional group may be further contained in the matrix resin solution. The (meth) acrylic monomer may dilute the matrix resin solution to adjust the viscosity. The (meth) acrylic monomer may be a single functional or multifunctional (meth) acrylic monomer that is polymerized together with the epoxy acrylate. For example, the (meth) acrylic monomer including the at least one functional group may include trimethylol triacrylate, trimethylol trimethacrylate, tripropyleneglycol diacrylate, triethylene glycol diacrylate, 1,6-Hexanediol diacrylate, tetrahydrofurfuryl acrylate, pentaerythritol triacrylate, and diethylene glycol diemthacrylate.

A content of the (meth) acrylic monomer including the at least one functional group may be about 60 wt % or less, preferably, about 0.1 wt % to about 50 wt %, more preferably, about 1 wt % to about 50 wt % of the total weight of the matrix resin solution. If the content of the (meth) acrylic monomer exceeds about 60 wt %, the degradation prevention performance of the quantum dot may be deteriorated.

A light scattering agent may be further contained in the matrix resin solution. That is, the light scattering agent effectively scatters excitation light and emission lien in the light conversion film. For this, inorganic light scattering agent or organic light scattering agent may be used as the light scattering agent. An example of the inorganic light scattering agent may be a particle including silicon, silica, alumina, TiO2, ZrO2, barium sulfate), ZnO, or a combination thereof, and an example of the organic light scattering agent may include a polymer particle including poly(methylmethacrylate), a PMMA-based polymer, benzoguanamine-based polymer, or a combination thereof. The inorganic light scattering agent and organic light scattering agent may also be used alone or used to be mixed with each other. Alternatively, two kinds of light scattering agents having sizes different from each other may be mixed and then used.

In addition, the content of the light scattering agent may be about 20 wt % or less, preferably, about 1 wt % to about 20 wt %, more preferably, about 5 wt % to about 15 wt % of the total weight of the matrix resin solution. If the content of the light scattering agent is out of the above-described range, light absorption may increase due to the light scattering agent to deteriorate light use efficiency, cause non-uniformity in film, and generate haze.

Next, in operation S2, a quantum dot dispersion solution including a quantum dot, a nonpolar (meth)acrylate monomer, and oligomer having polar moiety and nonpolar moiety is prepared. In more detail, the quantum dot represents a light emitting nano particle having a predetermined size with a quantum confinement effect. The quantum dot may be a several nano-sized semiconductor crystal that is prepared through a chemical synthetic process and converts a wavelength of light incident from a light source to emit light having the converted wavelength.

The quantum dot may be, for example, a particle having a single layer or multi-layered structure including at least one kind of semiconductor crystal selected from the group consisting of CdS, CdO, CdSe, CdTe, $Cd_3P_2$, $Cd_3As_2$, ZnS, ZnO, ZnSe, ZnTe, MnS, MnO, MnSe, MnTe, MgO, MgS, MgSe, MgTe, CaO, CaS, CaSe, CaTe, SrO, SrS, SrSe, SrTe, BaO, BaS, BaSe, BaTE, HgO, HgS, HgSe, HgTe, $HgI_2$, AgI, AgBr, $Al_2O_3$, $Al_2S_3$, $Al_2Se_3$, $Al_2Te_3$, $Ga_2O_3$, $Ga_2S_3$, $Ga_2Se_3$, $Ga_2Te_3$, $In_2O_3$, $In_2S_3$, $In_2Se_3$, $In_2Te_3$, $SiO_2$, $GeO_2$, $SnO_2$, SnS, SnSe, SnTe, PbO, $PbO_2$, PbS, PbSe, PbTe, AlN, AlP, AlAs, AlSb, GaN, GaP, GaAs, GaSb, $GaInP_2$, InN, InP, InAs, InSb, $In_2S_3$, $In_2Se_3$, $TiO_2$, BP, Si, Ge, and a combination thereof.

The quantum dot may have a diameter of about 1 nm to about 10 nm. Since the quantum dot varies in light emitting wavelength according to its size, a quantum dot having an adequate size can be selected to obtain light having a desired color. In the current embodiment, the quantum dot may include, for example, at least one kind of quantum dot selected from the group consisting of a quantum dot that converts blue light into red light, a quantum dot that converts blue light into green light, and a quantum dot that converts green light into red light.

The quantum dot may also include a capping layer on the surface thereof to prevent the quantum dots from being aggregated with respect to each other. For example, the capping layer may be a ligand layer that is coordinate bonded to the surface of the quantum dot or a surface layer that is coated with a hydrophobic organic molecule. For example, the capping layer may be a material layer selected from the group consisting of phosphine oxide, organic amine, organic acid, phosphonic acid, which have a long chain alkyl or aryl group, and a combination thereof. For example, the capping layer may be a material layer selected from the group consisting of tri-n-octylphosphine oxide (TOPO), stearic acid, palmitic acid, octadecylamine, dodecylamine, lauric acid, oleic acid, hexyl phosphonic acid, and a combination thereof.

A content of the quantum dot may be about 0.1 wt % to about 10 wt %, preferably, about 1 wt % to about 10 wt %, more preferably, about 1 wt % to about 5 wt % of the total weight of the quantum dot dispersion solution. If the content of the quantum dot is out of the above-described range, the light conversion effect may be slight, or a distance between the quantum dots may be reduced to deteriorate the light use efficiency.

A content of the nonpolar (meth)acrylate monomer may be about 20 wt % to about 90 wt %, preferably, about 30 wt % to about 80 wt %, more preferably, about 60 wt % to about 80 wt % of the total weight of the quantum dot dispersion solution. If the content of the nonpolar (meth)acrylate monomer satisfies the above-described range, the quantum dots may be smoothly dispersed, and then the dispersion of the quantum dots may be maintained by adding the oligomer.

Next, the oligomer having the polar moiety and nonpolar moiety can be configured to maintain liquid drops without being aggregated with each other when the matrix resin solution and the quantum dot dispersion solution are mixed to form the liquid drops through phase-separation. For this, the oligomer may have to include the polar moiety that is capable of being bonded to a surface of the quantum dot and the nonpolar moiety that is capable of being dissolved with the nonpolar acrylate monomer. The oligomer may be a polymer having a weight-average molecular weight of about 1,000 g/mol or less and including at least two repeating units.

In the current embodiment, the polar moiety and the nonpolar moiety within the oligomer are not limited in their configuration. For example, the moiety and the nonpolar moiety within the oligomer may be provided as the form of a block copolymer in which a block consisting of the polar moiety and a block consisting of the nonpolar moiety are bonded to each other, the form of a random copolymer in which a repeating unit having the polar moiety and a repeating unit having the nonpolar moiety are randomly bonded to each other, a structure in which the nonpolar moiety exists in a main chain, and the polar moiety exists in a side chain, or a structure in which the polar moiety exists in the main chain, and the nonpolar moiety exists in the side chain.

Here, the polar moiety may include at least one kind of polar group selected from the group consisting of a ketone group, an ester group, an ether group, a carboxyl group, hydroxyl group, an amide group, an amine group, and a cyclic acid anhydride group. The cyclic acid anhydride group may be, for example, a succinin anhydride group, a maleic anhydride group, a glutaric anhydride group, or a phthalic anhydride group. The nonpolar moiety may include a hydrocarbon chain consisting of carbon and hydrogen.

A content of the oligomer having the polar moiety and the nonpolar moiety may be about 10 wt % to about 80 wt %, preferably, about 20 wt % to about 70 wt %, more preferably, about 20 wt % to about 40 wt % of the total weight of the quantum dot dispersion solution.

Additional components in addition to the above-described components may be contained in the quantum dot dispersion solution to adjust physical properties of the quantum dot dispersion solution. For example, the photo-initiator may be further contained in the quantum dot dispersion solution. The photo-initiator may polymerize the nonpolar acrylate in a curing process that will be described later. In the current embodiment, radical-type photopolymerization initiators that well known in this technical fields may be used without being limited. Also, at least two kinds of initiators may be mixed with each other and then used as the photo-initiator.

A metal-based initiator, an epoxy-based initiator, an iso-cyanate-based initiator, or an amine-based initiator may be used as the photo-initiator. In addition, an initiator that comes into the market, for example, the Irgacure 184 may be used as the photo-initiator. In addition, a content of the photo-initiator may be about 35 wt % or less, preferably, about 0.5 wt % to about 30 wt %, more preferably, about 1 wt % to about 10 wt % of the total weight of the quantum dot dispersion solution. Also, a (meth) acrylic monomer including at least one functional group may be further contained in the quantum dot dispersion solution. The (meth) acrylic monomer may be polymerized with the nonpolar acrylic monomer and/or oligomer in the curing process to help the formation of a network having a mesh structure. For example, the (meth) acrylic monomer may include trimethylol triacrylate, trimethylol trimethacrylate, tripropyleneglycol diacrylate, triethylene glycol diacrylate, 1,6-Hexanediol diacrylate, tetrahydrofurfuryl acrylate, pentaerythritol triacrylate, and diethylene glycol diemthacrylate.

A content of the (meth) acrylic monomer including the at least one functional group may include about 30 wt % or less, preferably, about 10 wt % or less, more preferably, about 50 wt % or less of the total weight of the quantum dot dispersion solution. If the content of the (meth) acrylic monomer is too large, the dispersion of the quantum dots may be deteriorated.

Also, the light scattering agent may be further contained in the quantum dot dispersion solution. The light scattering agent may effectively scatter excitation light and emission lien in the light conversion film. For this, inorganic light scattering agent or organic light scattering agent may be used as the light scattering agent. An example of the inorganic light scattering agent may be a particle including silicon, silica, alumina, $TiO_2$, $ZrO_2$, barium sulfate, ZnO, or a combination thereof, and an example of the organic light scattering agent may include a polymer particle including poly(methylmethacrylate), a PMMA-based polymer, benzoguanamine-based polymer, or a combination thereof. The inorganic light scattering agent and organic light scattering agent may be used alone or used to be mixed with each other. Alternatively, two kinds of light scattering agents having sizes different from each other may be mixed and then used.

A content of the light scattering agent may be about 20 wt % or less, preferably, about 1 wt % to about 20 wt %, more preferably, about 5 wt % to about 15 wt % of the total weight of the quantum dot dispersion solution. If the content of the light scattering agent is too large, light adsorption may increase due to the light scattering agent to deteriorate light use efficiency, cause non-uniformity in film, and generate haze.

When the matrix resin solution and the quantum dot dispersion solution are formed through the above-described processes, the matrix resin solution and the quantum dot dispersion solution may be mixed with each other to form a resin mixed solution in operation S3. Here, a mixed ratio of the matrix resin solution and the quantum dot dispersion solution may be a weight ratio of about 1:1 to about 4.0:0.1, preferably, about 1:1 to about 4:1, more preferably, about 2.75:2.25 to about 3.5:1.5. If the mixed ratio is out of the above-described range, a micro phase may not be formed, a distance between the quantum dots may be too close to each other thereby deteriorating the dispersion, or the light efficiency may be deteriorated.

In the current embodiment, since the matrix resin solution has the polarity, and the quantum dot dispersion solution has the nonpolarity due to the nonpolar acrylate that is a main component thereof, the phase separation between the matrix resin solution and the quantum dot dispersion solution occurs to form a liquid drop including the quantum dot. Here, the polar moiety of the oligomer contained in the quantum dot dispersion solution may be bonded to the surface of the quantum dot, and the nonpolar moiety may be bonded to the nonpolar acrylate. Thus, the liquid drops are be aggregated with each other within the matrix rein, but are maintained in the dispersed state.

As a result, the liquid drop including the quantum dot can be maintained at a size of about 50 μm or less, preferably, about 0.1 μm to about 20 μm, more preferably, about 0.1 μm to about 10 μm. As described above, since the liquid drop has a small size, a phenomenon in which stripes are generated by the dragging of a coating bar during a coating process can be prevented. Thus, a film having relatively uniform optical performance can be prepared over an entire area of the film.

Next, the resin mixed solution may be cured to form a quantum dot-polymer complex. Here, the curing is performed by light irradiation after the resin mixed solution is applied to a base film. For example, after the resin mixed solution is applied to the base film, UV rays may be irradiated to perform the photo-curing.

Figure 2:
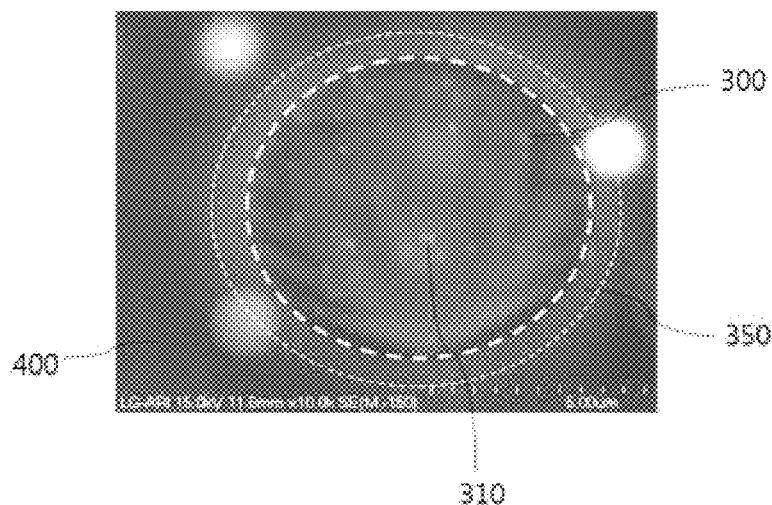
FIG. 2 is a photograph of a light conversion film including a quantum dot-polymer complex according to an embodiment.

FIG. 2 is a scanning optical microscope photograph of a quantum dot-polymer complex prepared by the above-described method. As illustrated in FIG. 2, the quantum dot-polymer complex according to an embodiment includes a first phase 400 formed of a matrix resin, a second phase 300 dispersed in the first phase 400 and including a quantum dot 310 therein, and a third phase 350 formed along a surface of the second phase 300 between the first and second phases 400 and 300.

Here, the matrix resin forming the first phase 400 may be a resin having low moisture-permeability and vapor-permeability as described above. That is, the resin may include a repeating unit that is derived from epoxy acrylate. The repeating unit derived from the epoxy acrylate may be, but is not limited thereto, a repeating unit that is represented by following (Chemical Formula 4).

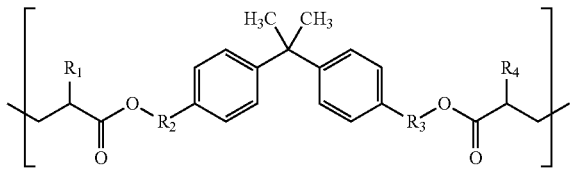
(Chemical Formula 4)

In (Chemical Formula 4), each of $R_1$ and $R_4$ is independently selected from hydrogen or $C_{1-10}$ alkyl, and each of $R_2$ and $R_3$ is independently selected from

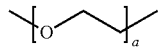

(where, a is integers 1 to 10) or

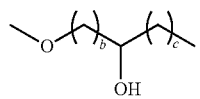

(where, b and c are independently selected from integers 0 to 10).

The second phase 300 may include a quantum dot and have a globular shape. In the quantum dot-polymer complex prepared according to the above-described method, the third phase 350 is disposed between the first phase 400 formed of the matrix resin and the second phase 300 including the quantum dot, and the second phase 300 is not aggregated within the first phase 400, but is well dispersed within the first phase 400. Thus, the second phase 300 can have a relatively fine uniform size. Particularly, the second phase 300 may have an average particle diameter of about 50 μm or less, preferably, about 0.1 μm to about 20 μm, more preferably, about 0.1 μm to about 10 μm.

The third phase 350 may include a unit that is derived from oligomer having polar moiety and nonpolar moiety. Here, the polar moiety and the nonpolar moiety may be the same as described above. That is, the polar moiety may include at least one kind of polar group selected from the group consisting of a ketone group, an ester group, an ether group, a carboxyl group, hydroxyl group, an amide group, an amine group, and a cyclic acid anhydride group, and the nonpolar moiety may be include a hydrocarbon chain consisting of carbon and hydrogen.

The quantum dot-polymer complex may further include a unit that is derived from a nonpolar (meth)acrylate monomer. Here, the nonpolar (meth)acrylate monomer may be contained in the quantum dot dispersion solution. For example, the nonpolar (meth)acrylate monomer may be at least one kind of material selected from the group consisting of lauryl acrylate, lauryl methacrylate, isobornyl acrylate, and isobornyl methacrylate. The unit that is derived from the nonpolar (meth)acrylate monomer may be polymerized with the oligomer within the quantum dot dispersion solution to exist within the second phase 300. During the phase separation, a portion of the nonpolar (meth)acrylate monomer may be dissolved into the matrix resin solution and then be polymerized with the matrix resin to exist the first phase 140.

The quantum dot-polymer complex may further include a unit that is derived from a (meth) acrylic monomer including at least one functional group. The nonpolar (meth) acrylic monomer including the at least one functional group may be contained in the quantum dot dispersion solution and/or the matrix resin solution to adjust physical properties thereof. For example, the (meth) acrylic monomer including the at least one functional group may include at least one kind of material selected from the group consisting of trimethylolpropane triacrylate, trimethylolpropane trimethacrylate, tripropyleneglycol diacrylate, triethylene glycol diacrylate, 1,6-Hexanediol diacrylate, tetrahydrofurfuryl acrylate, pentaerythritol triacrylate, and diethylene glycol diemthacrylate.

Also, the quantum dot-polymer complex may further include a light scattering agent. Here, the light scattering agent can be contained in the quantum dot dispersion solution and/or the matrix resin solution to adjust physical properties thereof. The light scattering agent may be an inorganic light scattering agent or organic light scattering agent. More particularly, the light scattering agent may be at least one kind of material selected from the group consisting of silicon, silica, alumina, $TiO_2$, $ZrO_2$, barium sulfate, ZnO, a poly(methylmethacrylate)-based polymer, a benzoguanamine-based polymer, and a combination thereof.

In the quantum dot-polymer complex, since the aggregation of the second phase is prevented due to the third phase that exists between the first and second phases, when the film is prepared, the film may be uniform. Thus, relatively uniform optical performance may be realized over the entire area of the film. In the quantum dot-polymer complex, since the resin having the low moisture-permeability and vapor-permeability is used as the matrix resin, degradation of the quantum dot due to oxygen and moisture may be minimized.

Figure 3:
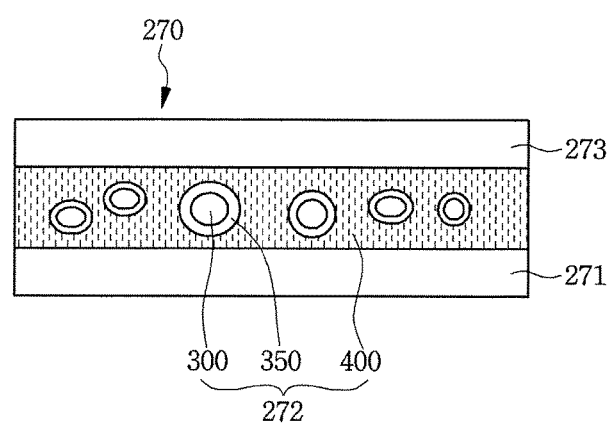
FIG. 3 is a view illustrating a structure of the light conversion film according to an embodiment.

Next, a light conversion film according to an embodiment will be described below. In particular, FIG. 3 is a view of a light conversion film according to an embodiment. Referring to FIG. 3, a light conversion film 270 according to an embodiment includes a first barrier film 271, a light conversion layer 272, and a second barrier film 273.

In more detail, the light conversion film 270 according to an embodiment may be prepared by applying a resin mixed solution, which is formed by mixing the matrix resin solution and the quantum dot dispersion solution, between the first barrier film 271 and the second barrier film 273 and then by curing the resin mixed solution. Here, an object to which the resin mixed solution is applied is not specifically limited. That is, the resin mixed solution may be applied to one of the first and second barrier films 271 and 273.

After the resin mixed solution is applied, the barrier film to which the resin mixed solution is not applied may be stacked to irradiate UV rays, thereby curing the resin mixed solution to form the light conversion layer 272 including the quantum dot-polymer complex that includes the first phase 400 formed of the matrix resin, the second phase 300 dispersed in the first phase 400 and including the quantum dot 310 therein, and the third phase 350 formed along the surface of the second phase 300 between the first and second phases 400 and 300. Since the quantum dot-polymer complex has been previously described, its detailed description will be omitted.

In addition, the first barrier film 271 and the second barrier film 273 support and protect the light conversion layer 272. In more detail, the first and second barrier films 271 and 273 may prevent moisture or oxygen in external air from permeating into the light conversion layer 272, thereby allowing the quantum dots to be degraded.

For this, the first and second barrier films 271 and 273 may include a single material or complex material that is capable of blocking the introduction of the moisture and/or oxygen. For example, the first and second barrier films 271 and 273 may include a polymer having a high blocking property with respect to the moisture and/or oxygen, for example, polyethylene, polypropylene, polyvinyl chloride, polyvinyl alcohol, ethylene vinylalcohol, polychlorotriplefluoroethylene, polyvinylidene chloride, nylon, polyamino ether, and cycloolefin-based homopolymer or copolymer.

In the drawing, each of the first and second barrier films 271 and 273 are provided as a single layer, but is not limited thereto. Each of the first and second barrier films 271 and 273 may be provided as a multilayer. For example, each of the first and second barrier films 271 and 273 may have a structure in which a base film and a protection film disposed on the base film are stacked with each other.

For example, the first and second barrier films 271 and 273 may have a structure in which an inorganic film or organic-inorganic hydride film having a high blocking property with respect to the moisture and/or oxygen is applied to the base film. Here, the inorganic film or organic-inorganic hydride film may be formed of oxide such as Si, Al, and the like or nitride as a main component. In this instance, a polymer film having high light transmittance and heat-resistance may be used as the base film. For example, a polymer film including polyethylene terephthalate (PET), polyethylene naphthalate (PEN), cyclic olefin copolymer (COC), cyclic olefin polymer (COC), and the like may be used as the base film.

Each of the first and second barrier films 271 and 273 may have a moisture-permeation rate of about $10^{-1}$ g/m$^2$/day to about $10^{-5}$ g/m$^2$/day under a temperature of about 37.8° C. and relative humidity of about 100% and a moisture-permeation rate of about $10^{-1}$ cc/m$^2$/day/atm to $10^{-2}$ cc/m$^2$/day/atm under a temperature of about 23° C. and relative humidity of about 0%. Also, each of the first and second barrier films 271 and 273 may have a linear permeation rate of about 88% to about 95% in a visible ray region of about 420 nm to about 680 nm.

As described above, the light conversion film 270 according to an embodiment can have a significantly low degradation at an edge portion thereof under high-temperature high-humidity environments because the matrix resin of the light conversion layer 272 is formed of the resin having the low moisture-permeability and/or vapor-permeability as the main component. Particularly, the light conversion film according to an embodiment has a damaged length of about 2 mm or less, preferably, about 1 mm or less after at the edge portion when a variation at the edge portion is measured after leaving the light conversion film for four days under conditions of a temperature of about 60° C. and relative humidity of about 90%.

Figure 4:
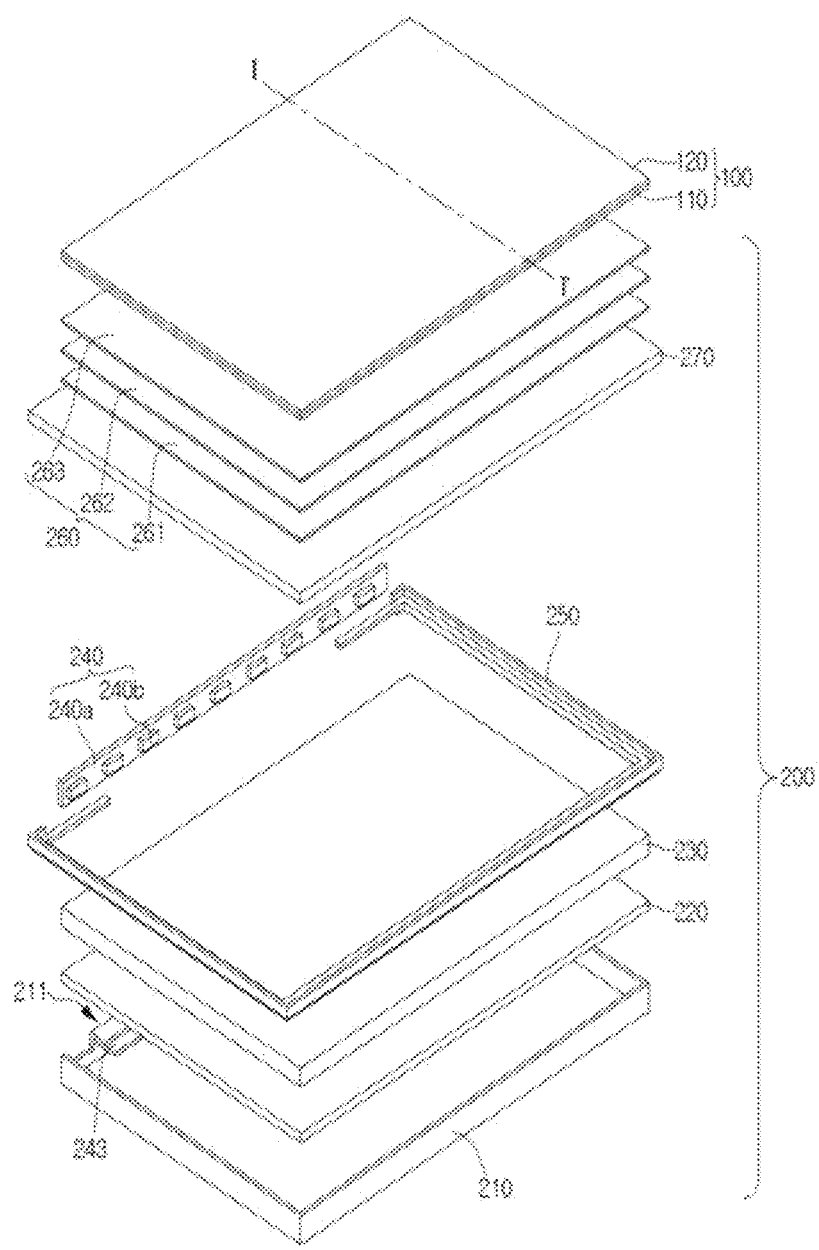
FIGS. 4 and 5 are views of a display device according to an embodiment.
Figure 5:
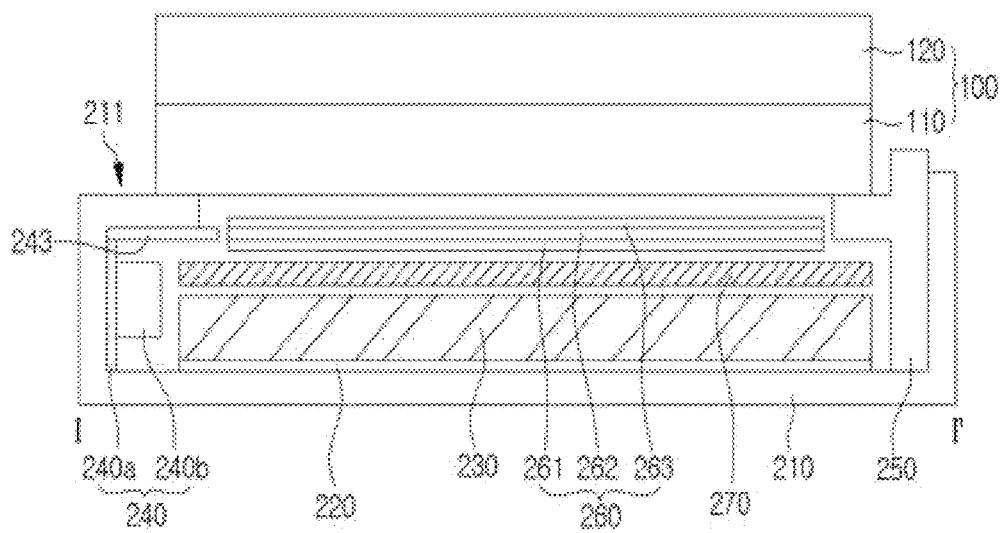

Next, a backlight unit and display device according to an embodiment will be described below. In particular, FIGS. 4 and 5 are views of a display device according to an embodiment. As illustrated in FIGS. 4 and 5, the display device according to an embodiment includes a backlight unit 200 and a display panel 100.

Each of the backlight unit 200 and the display device includes the light conversion film 270 according to an embodiment, i.e., a first barrier film 271, a light conversion layer 272 disposed on the first barrier film 271, and a second barrier film 273 disposed on the light conversion layer 272. The light conversion layer 272 includes a quantum dot-polymer complex a first phase 400 formed of a matrix resin, a second phase 300 dispersed in the first phase 400 and including a quantum dot 310 therein, and a third phase 350 formed along a surface of the second phase 300 between the first and second phases 400 and 300.

In more detail, the back light unit provides light to the display panel 100. Thus, the backlight unit 200 includes a light source unit 240 and the light conversion film 270 according to an embodiment. Also, the backlight unit 200 may further include a bottom case 210, a reflection plate 220, a light guide plate 230, a guide panel 250, and an optical sheet 260. Since the detailed descriptions with respect to the light conversion film 270 are previously described, only other components of the backlight unit will be described.

First, the light source unit 240 can provide light to the display panel 100 and be disposed within the bottom case 210. For example, the light source unit 240 includes a plurality of light sources 240b and a printed circuit board 240a on which the plurality of light sources 240b are mounted. Here, each of the light sources 240b may be a blue light source that emits blue light. For example, the light source 240b may be a blue light emitting diode. In this instance, the light conversion film 270 may include the quantum dot-polymer complex including a quantum dot that converts blue light into red light and a quantum dot that converts blue light into green light.

Alternatively, the light source 240b may be a combination of the blue light source for emitting blue light and a green light source for emitting green light. For example, the light source 240b may be a combination of a blue light emitting diode and a green light emitting diode. Here, the light conversion film 270 may include the quantum dot-polymer complex including a quantum dot that converts blue light into red light and a quantum dot that converts the green light into red light. In this instance, since green dots which are the majority of the quantum dots used in the light conversion film are not used, the demand quantity of quantum dots may be significantly reduced. As a result, the light conversion film can be reduced in manufacturing cost and thickness. Thus, the light conversion film is advantageous in slimness.

The printed circuit board 240a is electrically connected to the light source 240b. Further, the light source 240b can receive a driving signal through the printed circuit board 240a and thus be driven. The printed circuit board 240a may also have a mount surface on which the light source 240b is mounted and an adhesion surface facing the mount surface. The adhesion surface of the printed circuit board 240a is attached to the bottom case 210. The printed circuit board 240a may have a bar shape and be disposed on one side of the bottom case 210.

Although the printed circuit board 240a is attached to an inner surface of the bottom case 210 in the drawing, but is not limited thereto. The printed circuit board 240a may be attached to an inner top surface of the bottom case 210 or a lower surface of a bent extending part 211 of the bottom case 210. In addition, although the light source unit 240 is disposed on one side of the bottom case 210 in the drawing, is not limited thereto. For example, the light source unit 240 can be disposed on each of both sides facing each other within the bottom case 210. Also, although an edge type backlight unit 200 is illustrated in the drawing, a direct type backlight unit 200 may be used. That is, the light source unit 240 may be disposed on the inner top surface of the bottom case 210.

In addition, the bottom case 210 has an opened upper portion and a side wall that extends in a close-loop shape to accommodate the light emitting unit 240, the light guide plate 230, the reflection plate 220, the optical sheet 260, and the light conversion film 270. Here, at least one sidewall of the bottom case 210 may include a bent extending part 211 that is bent to extend from an upper edge, thereby covering the light source unit 240. That is, one side of the bottom case 210 may have a "⊏"-shaped cross-section. Here, a reflection member 243 may be further disposed on a bottom surface of the bent extending part 211.

The reflection member 243 may be a light source housing, a reflection film, or a reflection tape. The reflection member 243 prevents light emitted from the light source unit 240 from being directly emitted to the display panel 100. Also, the reflection member 243 can increase an amount of light incident into the light guide plate 230. Thus, the reflection member 243 improves the light efficiency, brightness, and image quality of the display device.

In the bottom case 210, the bent extending part 211 may be omitted. That is, the bottom case 210 may have one side cross-section with "⌐" shape. The bottom case 210 is coupled to the guide panel 250. Further, the guide panel 250 includes a protrusion therein. The display panel can also be seated on and supported by the protrusion of the guide panel 250. Thus, the guide panel 250 may be called a support main or mold frame.

In addition, the guide panel 250 is disposed to surround an edge of the backlight unit 200 so as to be bonded to the display panel 100. That is, the guide panel 250 has a frame shape. For example, the guide panel 250 may have a rectangular frame shape. Also, the guide panel 250 may have an opening in an area of the bottom case 210 corresponding to the bent extending part 211.

Each of the bottom case 210 and the guide panel 250 may have a hook shape or include a protrusion or recessed part so that they are assembled with and coupled to each other. Also, the bottom case 210 and the guide panel 250 can be adhered to each other by using an adhesive. However, although not limited to the drawing, the guide panel 250 may be disposed on the light source unit 240. Here, the reflection member 243 may be disposed on the bottom surface of the guide panel 250 corresponding to the light source unit 240.

Next, the light guide plate 230 can uniformly guide light provided from the light source unit 240 to a liquid crystal display panel 100 through total reflection, refraction, and scattering. Here, the light guide plate 230 is accommodated into the bottom case 210.

Although the light guide plate 230 has a predetermined thickness in the drawing, it is not limited to the shape of the light guide plate 230. For example, the light guide plate 230 may have a thickness that is slightly thinner than that of both sides or a central portion of the light guide plate 230 to reduce the total thickness of the backlight unit 200. Also, the more the light guide plate 230 has a thickness that gradually decreases, the more the light guide plate 230 is away from the light source unit 240.

Also, one surface of the light guide plate 230 can have a specific pattern shape to supply uniform surface light. For example, the light guide plate 230 may have various patterns such as an elliptical pattern, polygonal pattern, hologram pattern, and the like to guide the incident light inward. Although the light source unit 240 is disposed on a side surface of the light guide plate 230 in the drawing, it is not limited thereto. The light source unit 240 may be disposed to correspond to at least one surface of the light guide plate 230. For example, the light guide unit 240 may be disposed to correspond to one side surface or both side surfaces of the light guide plate 230. Alternatively, the light guide unit 240 may be disposed to correspond to a bottom surface of the light guide plate 230.

In addition, the reflection plate 220 is disposed in a traveling path of light emitted from the light source unit 240. In more detail, the reflection plate 220 is disposed between the light guide plate 230 and the bottom case 210. That is, the reflection plate 220 is disposed under the light guide plate 230. The reflection plate 220 can thus reflect light traveling onto a top surface of the bottom case 210 toward the light guide plate 230 to improve light efficiency.

Unlike the drawing, if the light source unit 240 is disposed to correspond to the bottom surface of the light guide plate 230, the reflection plate 220 may be disposed on the light source unit 240. In more detail, the reflection plate 220 is disposed on the printed circuit board 240a of the light source unit 240. Also, the optical member 220 may have a plurality of holes to which the plurality of light sources 240 are coupled. That is, the plurality of light sources 240b may be inserted into the plurality of holes of the reflection plate 220, and the light sources 240 may be exposed to the outside. Thus, the reflection plate 220 can be disposed on a side of the light source 240b on the printed circuit board 240a.

Further, the optical sheet 260 is disposed on the light guide plate 230 to diffuse and collect light. For example, the optical sheet 260 may include a diffusion sheet 261, a first prism sheet 262, and a second prism sheet 263. The diffusion sheet 261 is disposed on the light guide plate 230 and improves uniformity of light that is transmitted therethrough. The diffusion sheet 261 may also include a plurality of beads.

In addition, the first prism sheet 262 is disposed on the diffusion sheet 261. The second prism sheet 263 is disposed on the first prism sheet 262. The first and second prism sheets 262 and 263 increase linearity of light that is transmitted therethrough. Thus, the light emitted onto the light guide plate 230 can pass through the optical sheet 260 and thus be processed into surface light having high brightness. The light conversion film 270 can be disposed between the optical sheet 260 and the light guide plate 230.

Next, the display panel 100 can realize an image and be, for example, a liquid crystal display panel (LCD). For example, the display panel 100 includes a first substrate 110 and a second substrate 120 which are bonded to each other with a liquid crystal layer therebetween. Also, a polarizing plate for selectively transmitting only specifically polarized light may be further disposed on an outer surface of each of the first and second substrates 110 and 120. That is, a polarizing plate may be disposed on each of a top surface of the first substrate 110 and a bottom surface of the second substrate 120.

In addition, the display panel 100 may have a display area and a non-display area. In more detail a gate line and data line are disposed on one surface of the first substrate 110 on the display area. The gate line and the data line also perpendicularly cross each other with a gate insulation layer therebetween to define a pixel area. Further, the first substrate 110 may be a thin film transistor substrate. A thin film transistor may be disposed on an intersection area between the gate line and the data line on one surface of the first substrate 110. That is, the thin film transistor is disposed on the pixel area. Also, a pixel electrode is disposed on each of pixel areas on one surface of the first substrate 110. The thin film transistor and the pixel electrode are electrically connected to each other.

In addition, the thin film transistor includes a gate electrode, a semiconductor layer, a source electrode, and a drain electrode. The gate electrode is branched from the gate line. Also, the source electrode may be branched from the data line. The pixel electrode may be electrically connected to the drain electrode of the thin film transistor.

The thin film transistor may have a bottom gate structure, a top gate structure, or a double gate structure. That is, the thin film transistor may be various changed and modified without departing from the spirit and scope of the embodiment. The second substrate 120 may be a color filter substrate. In addition, a black matrix having a lattice shape that covers the non-display area such as the thin film transistor formed on the first substrate 110 and surrounds the pixel area may be disposed on one surface of the second substrate 120 of the display panel 100. Also, a red color filter layer, a green color filter layer, and a blue color filter layer that are successively repeatedly arranged to correspond to each of the pixel areas may be disposed in the lattice.

Also, the display panel 100 includes a common electrode that generates electrical fields with the pixel electrode so as to drive the liquid crystal layer. A method for arranging the liquid crystal molecules may include a twisted nematic (TN) mode, a vertical alignment (VA) mode, an in plane switching (IPS) mode, or fringe field switching (FFS) mode. The common electrode may be disposed on the first or second substrate 110 or 120 according to the arrangement method of the liquid crystal molecules.

Further, the display panel 100 may have a color filter on transistor (COT) structure in which the thin film transistor, the color filter layer, and the black matrix are formed on the first substrate 110. The second substrate 120 is also bonded to the first substrate 110 with the liquid crystal layer therebetween. That is, the thin film transistor may be disposed on the first substrate 110, and the color filter layer may be disposed on the thin film transistor. Here, a protection film may be disposed between the thin film transistor and the color filter layer.

Also, a pixel electrode contacting the thin film transistor is disposed on the first substrate 110. Here, the black matrix may be omitted to improve an aperture ratio and simplify a masking process. Thus, the common electrode may share the function of the black matrix. Further, a driving circuit part for supplying a driving signal from the outside is connected to the display panel 100. The driving circuit part may be mounted on the substrate of the display panel 100 or be connected to the display panel 100 through a connection member such as a tape carrier package.

Next, the embodiments will be described in detail with reference to examples. However the present disclosure may be embodied in different forms and should not be constructed as limited to the embodiments set forth herein.

PREPARATION EXAMPLE 1

Matrix Resin Solution

About 20 wt % of trimethylolpropane triacrylate and about 5 wt % of Irgacure 184 that is an initiator were added to about 75 wt % of bisphenol A glycerolate diacrylate and then mixed with each other to prepare a matrix resin solution.

PREPARATION EXAMPLE 2

Quantum Dot Dispersion Solution

About 31 mg of InP/ZnS core-shell quantum dot powder was added to about 3 g of lauryl acrylate and about 1 g of isobornyl methacrylate, and then about 2 g of oligomer including polar moiety and nonpolar moiety was mixed and stirred to prepare a quantum dot dispersion solution.

(Embodiment 1)

A resin mixed solution that is obtained by mixing the matrix resin solution prepared by Preparation Example 1 and the quantum dot dispersion solution prepared by Preparation Example 2 at a ratio of about 2:3 was applied between a first barrier film (i-component, 50 μm) and a second barrier film (i-component, 50 μm) and then exposed to UV rays to prepare a light conversion film having a light conversion layer having a thickness of about 29 μm.

(Embodiment 2)

The same method as Embodiment 1 except for the light conversion layer is formed to have a thickness about 54 μm was performed to prepare a light conversion film.

(Embodiment 3)

A resin mixed solution that is obtained by mixing the matrix resin solution prepared by Preparation Example 1 and the quantum dot dispersion solution prepared by Preparation Example 2 at a ratio of about 1:4 was applied between a first barrier film (i-component, 50 μm) and a second barrier film (i-component, 50 μm) and then exposed to UV rays to prepare a light conversion film having a light conversion layer having a thickness of about 34 μm.

(Embodiment 4)

The same method as Embodiment 3 except for the light conversion layer is formed to have a thickness about 58 μm was performed to prepare a light conversion film.

(Embodiment 5)

A resin mixed solution that is obtained by mixing the matrix resin solution prepared by Preparation Example 1 and the quantum dot dispersion solution prepared by Preparation Example 2 at a ratio of about 0.5:4.5 was applied between a first barrier film (i-component, 50 μm) and a second barrier film (i-component, 50 μm) and then exposed to UV rays to prepare a light conversion film having a light conversion layer having a thickness of about 37 μm.

(Embodiment 6)

The same method as Embodiment 5 except for the light conversion layer is formed to have a thickness about 58 μm was performed to prepare a light conversion film.

(Comparative Example 1)

The quantum dot dispersion solution prepared by Preparation Example 2 was applied between the first barrier film (i-component, 50 μm) and the second barrier film (i-component, 50 μm) and then exposed to the UV rays to prepare a light conversion film having a light conversion layer having a thickness of about 29 μm.

(Experimental Example)

Figure 6:
FIG. 6 is a photograph showing a degree of degradation at edge portions of a light conversion film according to Embodiment 1 and a light conversion film according to Comparative Example 1.
Figure 6:
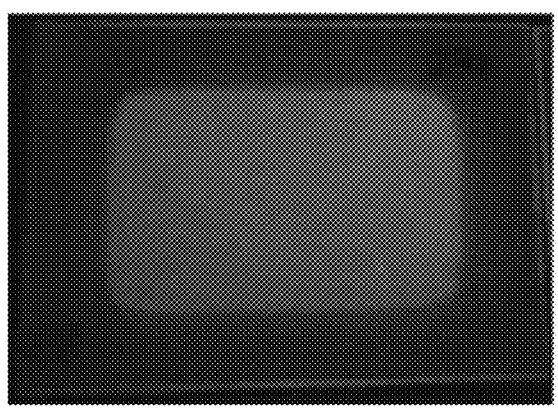

A test for measuring a degree of degradation at the edges of the light conversion films prepared by Embodiments 1 to 6 and Comparison Example 1 after leaving about four days under the conditions of a temperature of about 60° C. and relative humidity of about 90% was conducted. The test results are shown in Table 1 below. Also, FIG. 6 illustrates a photograph showing a degree of degradation of each of the light conversion films prepared by Embodiment 1 and Comparative Example 1. FIGS. 6A and 6B are photographs of the light conversion films prepared by Embodiment 1 and Comparative Example 1, respectively.

TABLE 1

| Classification | Degree of degradation at edge portion (mm) |
| --- | --- |
| Embodiment 1 | 1 |
| Embodiment 2 | 1 |
| Embodiment 3 | 1 |
| Embodiment 4 | 1.2 |
| Embodiment 5 | 1 |
| Embodiment 6 | 1.5 |
| Comparative Example 1 | 6 |

(Comparative Example 2)

About 25 mg of InP/ZnS core-shell quantum dot powder was added to about 1 g of a lauryl acrylate monomer and then stirred and mixed to prepare a quant dot dispersion solution. Then, the quantum dot dispersion solution was mixed with the matrix resin solution prepared by Preparation Example 1 to prepare a resin mixed solution. Here, a mixed ratio of the quantum dot dispersion solution to the matrix resin solution is a weight ratio of about 1:4.

Figure 7:
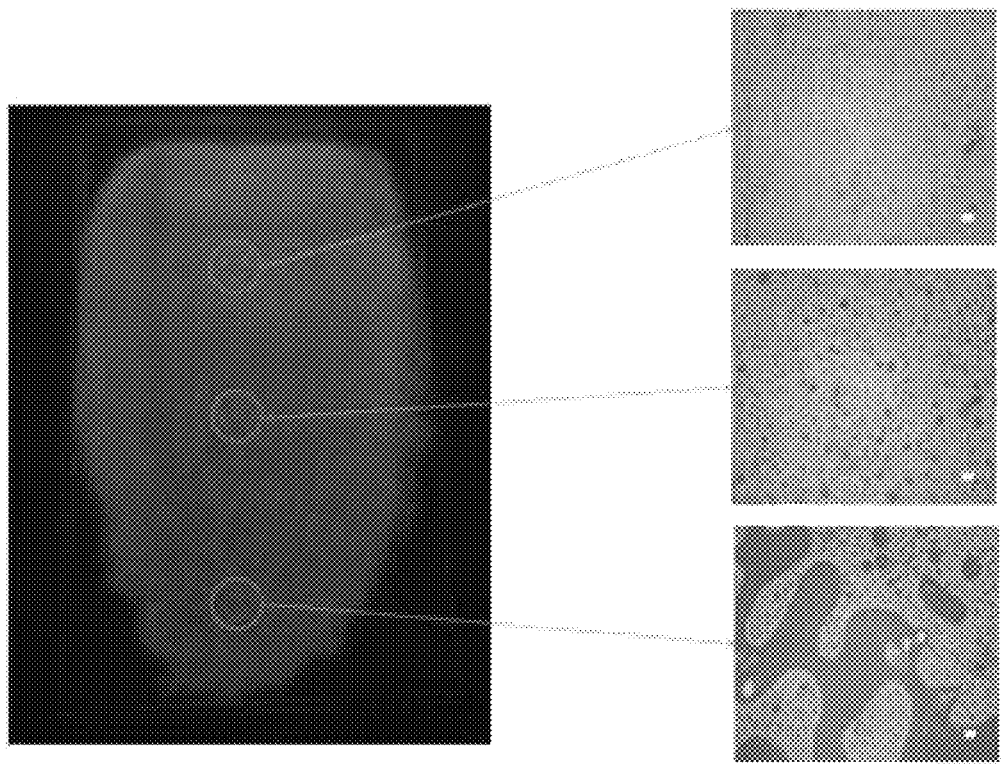
FIG. 7 is a photograph showing a state of a film prepared by using a resin mixed solution prepared by Comparative Example 2.

The resin mixed solution was applied between the first barrier film (i-component, 50 μm) and the second barrier film (i-component, 50 μm) by using a bar coating method and then exposed to the UV rays to prepare a light conversion film. FIG. 7 illustrates a photograph showing a coated state of the light conversion film prepared by Comparative Example 2. FIG. 7 illustrates an emulsion increases in size along the coating direction of the film. This is done because the emulsions including the quantum dots are further aggregated toward an end of the coating layer to cause the phase separation on a micro-scale.

The quantum dot-polymer complex according to the embodiment may have the low degradation under the high-temperature high-humidity environments by using the matrix resin having the low moisture-permeability and vapor-permeability to prepare the light conversion film having the superior stability. Also, the quantum dot-polymer complex prepared according to the embodiment may prepare the film having the uniform thickness to realize the uniform optical performance over the entire area of the film.

The present invention encompasses various modifications to each of the examples and embodiments discussed herein. According to the invention, one or more features described above in one embodiment or example can be equally applied to another embodiment or example described above. The features of one or more embodiments or examples described above can be combined into each of the embodiments or examples described above. Any full or partial combination of one or more embodiment or examples of the invention is also part of the invention.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A quantum dot-polymer complex comprising:
a first phase formed of a matrix resin;
a globular second phase dispersed in the first phase, the second phase comprising quantum dots, a ligand layer disposed on a surface of each quantum dot and bonded to the surface of each quantum dot, and a unit that is derived from a nonpolar (meth)acrylate monomer disposed between the quantum dots; and
a third phase disposed along a surface of the second phase with a predetermined thickness and between the first and second phases,
wherein the ligand layer includes one of tri-n-octylphosphine oxide (TOPO), stearic acid, palmitic acid, octadecylamine, dodecylamine, lauric acid, oleic acid, hexyl phosphonic acid, or a combination thereof,
wherein the third phase comprises a unit that is derived from an oligomer having a polar moiety and a nonpolar moiety, further wherein prior to curing to form the quantum dot-polymer complex, the polar moiety of the oligomer being bonded to a surface of each quantum dot and the nonpolar moiety of the oligomer is dissolved with nonpolar (meth)acrylate monomer,
wherein the nonpolar (meth)acrylate monomer of the globular second phase is polymerized with the oligomer of the third phase,
wherein the first phase comprises a repeating unit that is derived from epoxy (meth)acrylate, and
wherein the repeating unit that is derived from the epoxy (meth)acrylate is expressed as the following Chemical Formula:

(Chemical Formula)

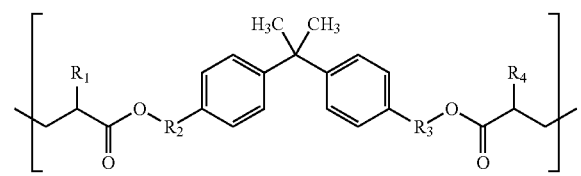

in the Chemical Formula, each of $R_1$ and $R_4$ is independently selected from hydrogen or methyl, and each of $R_2$ and $R_3$ is independently selected from

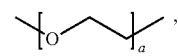

wherein a is an integer selected from 1 to 10, or

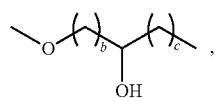

wherein b and c are integers selected from 1 to 10.

2. The quantum dot-polymer complex according to claim 1, wherein the second phase has an average particle diameter of about 50 μm or less.

3. The quantum dot-polymer complex according to claim 1, wherein the polar moiety comprises at least one kind of polar group selected from the group consisting of a ketone group, an ester group, an ether group, a carboxyl group, hydroxyl group, an amide group, an amine group, and a cyclic acid anhydride group.

4. The quantum dot-polymer complex according to claim 1, wherein the nonpolar moiety comprises a hydrocarbon chain consisting of carbon and hydrogen.

5. The quantum dot-polymer complex according to claim 1, wherein the nonpolar (meth)acrylate monomer comprises at least one kind of material selected from the group consisting of lauryl acrylate, lauryl methacrylate, isobornyl acrylate, and isobornyl methacrylate.

6. The quantum dot-polymer complex according to claim 1, further comprising a unit that is derived from a (meth) acrylate monomer comprising at least one functional group, wherein the (meth)acrylate monomer comprising the at least one functional group further comprises at least one kind of material selected from the group consisting of trimethylolpropane triacrylate, trimethylolpropane trimethacrylate, tripropyleneglycol diacrylate, triethylene glycol diacrylate, 1,6-Hexanediol diacrylate, tetrahydrofurfuryl acrylate, pentaerythritol triacrylate, and diethylene glycol dimethacrylate.

7. The quantum dot-polymer complex according to claim 1, further comprising a light scattering agent.

8. The quantum dot-polymer complex according to claim 7, wherein the light scattering agent comprises at least one material selected from the group consisting of silicon, silica, alumina, $TiO_2$, $ZrO_2$, barium sulfate, ZnO, a poly(methylmethacrylate)-based polymer, a benzoguanamine-based polymer, and a combination thereof.

9. A light conversion film comprising:
a first barrier film;
a light conversion layer disposed on the first barrier film; and
a second barrier film disposed on the light conversion layer,
wherein the light conversion layer comprises a quantum dot-polymer complex including a first phase formed of a matrix resin, a globular second phase dispersed in the first phase, the second phase comprising quantum dots, a ligand layer disposed on a surface of each quantum dot and bonded to the surface of each quantum dot, and a unit that is derived from a nonpolar (meth)acrylate monomer disposed between the quantum dots, and a third phase disposed along a surface of the second phase with a predetermined thickness and between the first and second phases,
wherein the ligand layer includes one of tri-n-octylphosphine oxide (TOPO), stearic acid, palmitic acid, octadecylamine, dodecylamine, lauric acid, oleic acid, hexyl phosphonic acid, or a combination thereof,
wherein the third phase comprises a unit that is derived from an oligomer having a polar moiety and a nonpolar moiety, further wherein prior to curing to form the quantum dot-polymer complex, the polar moiety of the oligomer being bonded to a surface of each quantum dot and the nonpolar moiety of the oligomer is dissolved with nonpolar (meth)acrylate monomer, wherein the nonpolar (meth)acrylate monomer of the globular second phase is polymerized with the oligomer of the third phase,
wherein the first phase comprises a repeating unit that is derived from epoxy (meth)acrylate, and
wherein the repeating unit that is derived from the epoxy (meth)acrylate is expressed as the following Chemical Formula:

(Chemical Formula)

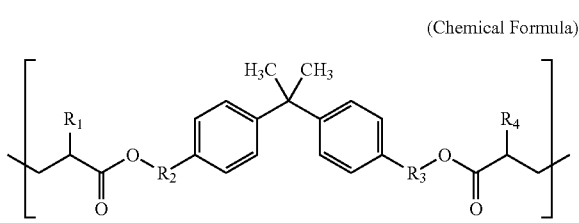

in the Chemical Formula, each of $R_1$ and $R_4$ is independently selected from hydrogen or methyl, and each of $R_2$ and $R_3$ is independently selected from

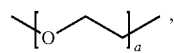

wherein a is an integer selected from 1 to 10, or

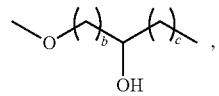

wherein b and c are integers selected from 1 to 10.

10. The light conversion film according to claim 9, wherein the light conversion film has a damaged length of about 2 mm or less at an edge portion, which is measured after leaving the light conversion film for four days under conditions of a temperature of about 60° C. and relative humidity of about 90%.

11. The light conversion film according to claim 9, wherein the quantum dot-polymer complex comprises at least one kind of quantum dot selected from the group consisting of a quantum dot that converts blue light into red light, a quantum dot that converts blue light into green light, and a quantum dot that converts green light into red light.

12. A backlight unit comprising:
a light source unit; and
a light conversion film,
wherein the light conversion film comprises:
a first barrier film;
a light conversion layer disposed on the first barrier film; and
a second barrier film disposed on the light conversion layer,
wherein the light conversion layer comprises a quantum dot-polymer complex including a first phase formed of a matrix resin, a globular second phase dispersed in the first phase, the second phase comprising quantum dots, a ligand layer disposed on a surface of each quantum dot and bonded to the surface of each quantum dot, and a unit that is derived from a nonpolar (meth)acrylate monomer disposed between the quantum dots, and a third phase disposed along a surface of the second phase with a predetermined thickness and between the first and second phases, wherein the ligand layer includes one of tri-n-octylphosphine oxide (TOPO), stearic acid, palmitic acid, octadecylamine, dodecylamine, lauric acid, oleic acid, hexyl phosphonic acid, or a combination thereof, wherein the third phase comprises a unit that is derived from an oligomer having a polar moiety and a nonpolar moiety, further wherein prior to curing to form the quantum dot-polymer complex, the polar moiety of the oligomer being bonded to a surface of each quantum dot and the nonpolar moiety of the oligomer is dissolved with nonpolar (meth)acrylate monomer, wherein the nonpolar (meth)acrylate monomer of the globular second phase is polymerized with the oligomer of the third phase, wherein the first phase comprises a repeating unit that is derived from epoxy (meth)acrylate, and wherein the repeating unit that is derived from the epoxy (meth)acrylate is expressed as the following Chemical Formula:

(Chemical Formula)

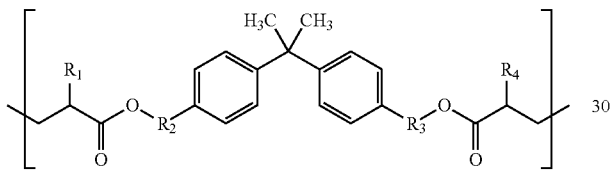

in the Chemical Formula, each of $R_1$ and $R_4$ is independently selected from hydrogen or methyl, and each of $R_2$ and $R_3$ is independently selected from

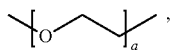

wherein a is an integer selected from 1 to 10, or

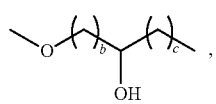

wherein b and c are integers selected from 1 to 10.

13. The backlight unit according to claim 12, wherein the light source unit comprises a blue light source that emits blue light, and wherein the quantum dot-polymer complex comprises a quantum dot that converts blue light into red light and a quantum dot that converts blue light into green light.

14. The backlight unit according to claim 12, wherein the light source unit comprises a blue light source that emits blue light and a green light source that emits green light, and wherein the quantum dot-polymer complex comprises a quantum dot that converts blue light into red light and a quantum dot that converts green light into red light.

15. A display device comprising:
a backlight unit comprising a light source and a light conversion film; and a display panel disposed on the backlight unit, wherein the light conversion film comprises a first barrier film, a light conversion layer disposed on the first barrier film, and a second barrier film disposed on the light conversion layer, and wherein the light conversion layer comprises a quantum dot-polymer complex including a first phase formed of a matrix resin, a globular second phase dispersed in the first phase, the second phase comprising quantum dots, a ligand layer disposed on a surface of each quantum dot and bonded to the surface of each quantum dot, a unit that is derived from a nonpolar (meth)acrylate monomer disposed between the quantum dots, and a third phase disposed along a surface of the second phase with a predetermined thickness and between the first and second phases, wherein the ligand layer includes one of tri-n-octylphosphine oxide (TOPO), stearic acid, palmitic acid, octadecylamine, dodecylamine, lauric acid, oleic acid, hexyl phosphonic acid, or a combination thereof, wherein the third phase comprises a unit that is derived from an oligomer having a polar moiety and a nonpolar moiety, further wherein prior to curing to form the quantum dot-polymer complex, the polar moiety of the oligomer being bonded to a surface of each quantum dot and the nonpolar moiety of the oligomer is dissolved with nonpolar (meth)acrylate monomer prior to curing to form the quantum dot-polymer complex, wherein the nonpolar (meth)acrylate monomer of the globular second phase is polymerized with the oligomer of the third phase, wherein the first phase comprises a repeating unit that is derived from epoxy (meth)acrylate, and wherein the repeating unit that is derived from the epoxy (meth)acrylate is expressed as the following Chemical Formula:

(Chemical Formula)

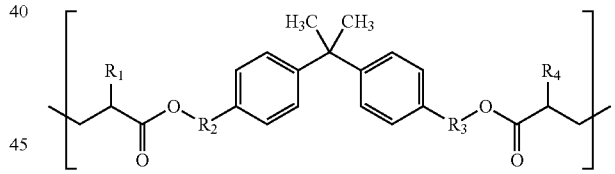

in the Chemical Formula, each of $R_1$ and $R_4$ is independently selected from hydrogen or methyl, and each of $R_2$ and $R_3$ is independently selected from

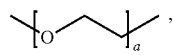

wherein a is an integer selected from 1 to 10, or

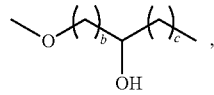

wherein b and c are integers selected from 1 to 10.

* * * * *